United States Patent
Kim et al.

(10) Patent No.: US 8,810,312 B2
(45) Date of Patent: Aug. 19, 2014

(54) APPARATUS AND METHOD FOR IMPROVING PERFORMANCE IN DOHERTY AMPLIFIER

(75) Inventors: Il-Du Kim, Suwon-si (KR); Bumman Kim, Pohang-si (KR)

(73) Assignees: Samsung Electronics Co., Ltd., Suwon-si (KR); Postech Academy-Industry Foundation Postech Univ. of Science and Technology, Pohang-si (KR)

( * ) Notice: Subject to any disclaimer, the term of this patent is extended or adjusted under 35 U.S.C. 154(b) by 124 days.

(21) Appl. No.: 13/345,579

(22) Filed: Jan. 6, 2012

(65) Prior Publication Data

US 2012/0176194 A1    Jul. 12, 2012

(30) Foreign Application Priority Data

Jan. 6, 2011    (KR) .................. 10-2011-0001267

(51) Int. Cl.
*H03F 3/68*    (2006.01)
*H03F 3/60*    (2006.01)

(52) U.S. Cl.
USPC .................. 330/124 R; 330/295; 330/53

(58) Field of Classification Search
USPC ....................... 330/124 R, 295, 53

IPC .................................................. H03F 3/68,3/60
See application file for complete search history.

(56) References Cited

U.S. PATENT DOCUMENTS

| | | | |
|---|---|---|---|
| 6,791,417 B2 * | 9/2004 | Pengelly et al. | 330/295 |
| 6,853,245 B2 * | 2/2005 | Kim et al. | 330/124 R |
| 7,193,472 B2 * | 3/2007 | Gotou et al. | 330/295 |
| 7,427,895 B1 * | 9/2008 | Okubo et al. | 330/124 R |
| 7,663,435 B2 * | 2/2010 | Kim et al. | 330/124 R |
| 8,339,196 B2 * | 12/2012 | Hong et al. | 330/124 R |
| 8,346,189 B2 * | 1/2013 | Dupuy et al. | 455/114.1 |

\* cited by examiner

*Primary Examiner* — Patricia Nguyen

(57) ABSTRACT

An apparatus and an operating method of an asymmetric Doherty power amplifier. A Doherty power amplifier apparatus includes a power divider configured to provide a power signal to a carrier amplifier and a peaking amplifier. The apparatus also includes the carrier amplifier configured to amplify a power of the signal input from the power divider. The apparatus further includes the peaking amplifier configured to have a maximum output power magnitude different from the carrier amplifier and amplify the power of the signal input from the power divider. The apparatus still further includes at least two offset transmission lines disposed at ends of the carrier amplifier and the peaking amplifier and configured to regulate a load impedance. The apparatus also includes an output combiner configured to combine and output outputs of the carrier amplifier and the peaking amplifier of different sizes.

20 Claims, 10 Drawing Sheets

APPARATUS AND METHOD FOR IMPROVING PERFORMANCE IN DOHERTY AMPLIFIER

CROSS-REFERENCE TO RELATED APPLICATION(S) AND CLAIM OF PRIORITY

The present application is related to and claims the benefit under 35 U.S.C. §119(a) to a Korean patent application filed in the Korean Intellectual Property Office on Jan. 6, 2011, and assigned Serial No. 10-2011-0001267, the entire disclosure of which is hereby incorporated by reference.

TECHNICAL FIELD

The present disclosure relates to a Doherty power amplifier.

BACKGROUND

In general, a Doherty power amplifier is actively studied as a technique for improving performance of a power amplifier in a backoff region.

The Doherty power amplifier is configured by connecting a carrier amplifier and a peaking amplifier in parallel using a quarter-wave transformer λ/4 line. Hence, as a power level increases, currents supplied from the peaking amplifier to the load increase. The Doherty power amplifier improves the efficiency by regulating load impedances of the carrier amplifier and the peaking amplifier.

According to the configuration, the Doherty power amplifier may include a symmetric 2-way Doherty power amplifier and an N-way Doherty power amplifier including (N−1)-ary peaking amplifiers.

The symmetric 2-way Doherty power amplifier cannot amplify a modulation signal of Peak to Average Power Ratio (PAPR) with a maximum efficiency because the backoff level is limited to 6 dB.

The N-way Doherty power amplifier can achieve higher efficiency of the modulation signal than the symmetric 2-way Doherty power amplifier, using the (N−1)-ary peaking amplifiers and phase delay lines. However, since the size rate of the peaking amplifier increases by integral multiples of the size of the carrier power amplifier, the backoff level of the N-way Doherty power amplifier is limited to 6 dB, 9.54 dB, and 12 dB as shown in FIG. 1. In addition, the N-way Doherty power amplifier has more input loss than the symmetric 2-way Doherty power amplifier.

SUMMARY

To address the above-discussed deficiencies of the prior art, it is a primary aspect of the present disclosure to provide an apparatus and a method for amplifying a modulation signal to achieve maximum efficiency in a Doherty power amplifier.

Another aspect of the present disclosure is to provide an apparatus and a method for amplifying a modulation signal to achieve maximum efficiency using an asymmetric Doherty power amplifier.

Yet another aspect of the present disclosure is to provide an apparatus and a method for amplifying a modulation signal to achieve maximum efficiency by regulating a size of a peaking amplifier in a Doherty power amplifier.

Still another aspect of the present disclosure is to provide an apparatus and a method for amplifying a modulation signal to achieve maximum efficiency by compensating for on-resistance of a backoff region in a Doherty power amplifier.

According to one aspect of the present disclosure, an apparatus of a Doherty power amplifier includes a power divider configured to provide a power signal to a carrier amplifier and a peaking amplifier. The carrier amplifier is configured to amplify a power of the signal input from the power divider. The peaking amplifier is configured to have a maximum output power magnitude different from the carrier amplifier and amplify the power of the signal input from the power divider. The apparatus also includes at least two offset transmission lines disposed at ends of the carrier amplifier and the peaking amplifier and configured to regulating a load impedance. The apparatus further includes an output combiner configured to combine and output outputs of the carrier amplifier and the peaking amplifier of different sizes.

According to another aspect of the present disclosure, an operating method of a Doherty power amplifier includes determining a maximum output of the Doherty power amplifier. The method also includes determining a size ratio of a carrier amplifier and a peaking amplifier using a Peak to Average Power Ratio (PAPR) of a modulation signal. The method further includes determining at least two characteristic impedances to combine outputs of the carrier amplifier and the peaking amplifier by considering the size ratio of the carrier amplifier and the peaking amplifier. The method still further includes combining the outputs amplified by the carrier amplifier and the peaking amplifier using the at least two characteristic impedances.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain exemplary embodiments of the present disclosure will be more apparent from the following description taken in conjunction with the accompanying drawings, in which.

Throughout the drawings, like reference numerals will be understood to refer to like parts, components and structures.

DETAILED DESCRIPTION OF THE INVENTION

Figure 1:
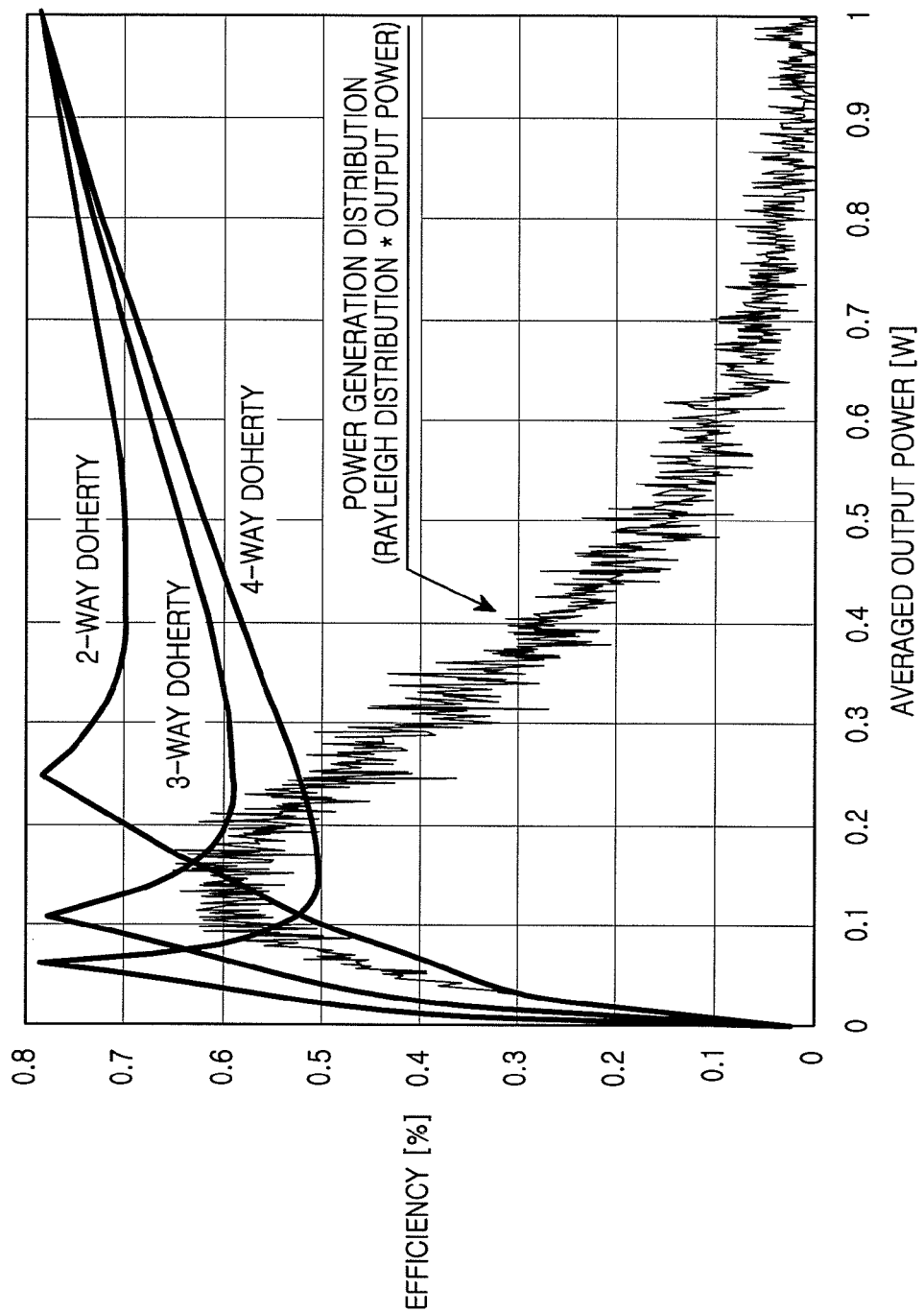
FIG. 1 illustrates power generation distribution of a general modulation signal and efficiency characteristics of an N-way Doherty power amplifier.

FIGS. 2 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system. Embodiments of the present disclosure will be described herein below with reference to the accompanying drawings.

In the following description, well-known functions or constructions are not described in detail since they would obscure the disclosure in unnecessary detail. Terms described below, which are defined considering functions in the present disclosure, can be different depending on user and operator's intention or practice. Therefore, the terms should be defined based on the disclosure throughout this specification. Preferred embodiments of the present disclosure will be described herein below with reference to the accompanying drawings.

The following description with reference to the accompanying drawings is provided to assist in a comprehensive understanding of exemplary embodiments of the disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of exemplary embodiments of the present disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present disclosure provide a technique for achieving maximum efficiency of a modulation signal having Peak to Average Power Ratio (PAPR) and linearly amplifying the output without loss in a Doherty power amplifier.

Hereinafter, using an asymmetric 2-way Doherty power amplifier including a carrier amplifier and a peaking amplifier in different size rates, the efficiency of the modulation signal having various PAPRs can be improved in a backoff power region. The size rate of the peaking amplifier determined in the Doherty power amplifier and a structure of an output power combiner are explained. Descriptions of well-known functions and constructions may be omitted for clarity and conciseness.

FIG. 1 illustrates power generation distribution of a general modulation signal and efficiency characteristics of an N-way Doherty power amplifier.

FIG. 1 depicts Power Generation Distribution (PGD) of the modulation signal and efficiency characteristics of an N-way Doherty power amplifier. Herein, the PGD indicates components by multiplying Rayleigh distribution of the modulation signal by an output power of the power amplifier. The PGD greatly affects average efficiency performance of the power amplifier. For example, the average efficiency of the modulation signal of the power amplifier can be expressed as Equation 1.

$$\eta_{avg} = \frac{\int_0^{P_{out,max}} p(P_{out}) P_{out} dP_{out}}{\int_0^{P_{out,max}} p(P_{out}) P_{dc}(P_{out}) dP_{out}} \quad [\text{Eqn. 1}]$$

In Equation 1, $\eta_{avg}$ denotes the average efficiency for the modulation signal, $p(P_{out})$ denotes the Rayleigh distribution of the modulation signal, $P_{out}$ denotes the output power of the power amplifier, and $P_{dc}$ denotes a Direction Current (DC) power consumption of the power amplifier.

The PGD in Equation 1 is determined by the product of $p(P_{out})$ and $P_{out}$. Hence, when the Doherty power amplifier has the maximum efficiency in the highest probability region of the PGD, the Doherty power amplifier can improve the whole average efficiency performance to the maximum.

As for the modulation signal, since the Rayleigh distribution varies according to the PAPR, the PGD also varies according to the PAPR. Thus, the backoff level at which the carrier amplifier of the Doherty power amplifier has the maximum efficiency should be varied according to the PAPR of the modulation signal.

Figure 2:
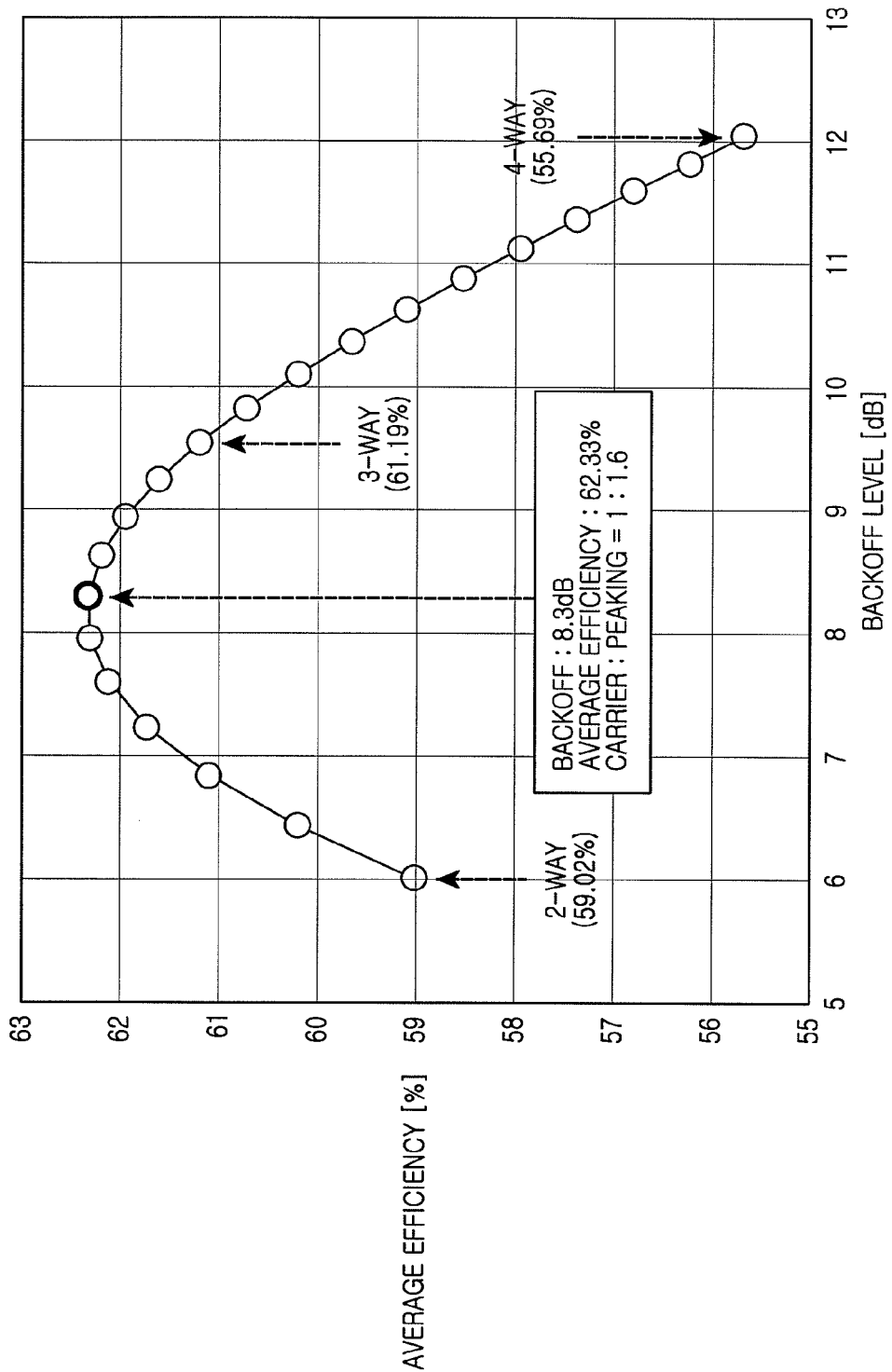
FIG. 2 illustrates an average efficiency of a Doherty power amplifier according to an embodiment of the present disclosure.

FIG. 2 depicts the average efficiency of a Doherty power amplifier according to an embodiment of the present disclosure. Hereafter, the average efficiency of the Doherty power amplifier for the signal having the PAPR of 8.5 dB calculated based on Equation 1 is explained. Herein, the horizontal axis indicates the backoff level, and the vertical axis indicates the average efficiency.

As shown in FIG. 2, the 2-way Doherty power amplifier having the backoff level of 6 dB exhibits an average efficiency of 59.02%. The 3-way Doherty power amplifier having the backoff level of 9.54 dB exhibits an average efficiency of 61.19%. The 4-way Doherty power amplifier having the backoff level of 12 dB exhibits an average efficiency of 55.69%.

As stated above, the N-way Doherty power amplifier cannot yield the backoff level of 8.3 dB of the Doherty power amplifier which achieves the highest efficiency of 62.33%. Accordingly, the modulation signal can be amplified to achieve the highest efficiency using the asymmetric 2-way Doherty power amplifier of FIG. 3.

Figure 3:
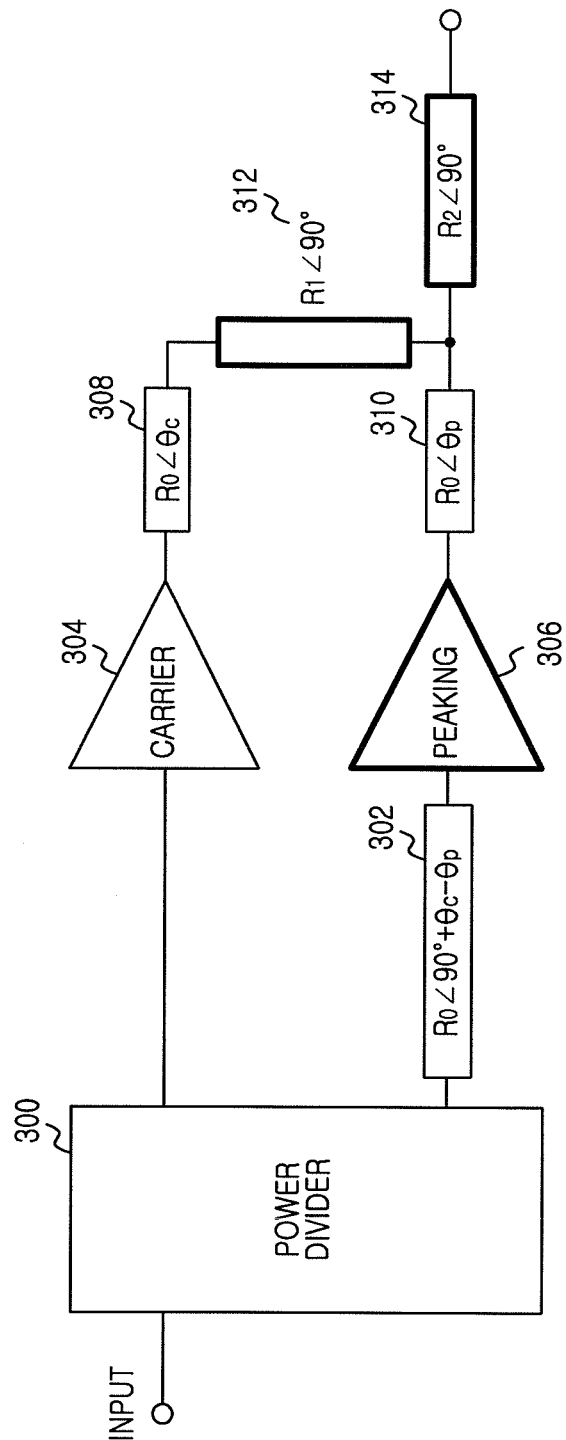
FIG. 3 illustrates the Doherty power amplifier according to an embodiment of the present disclosure.

FIG. 3 is a block diagram of the Doherty power amplifier according to an embodiment of the present disclosure.

As shown in FIG. 3, the Doherty power amplifier includes a power divider 300, a transmission line 302, a carrier amplifier 304, a peaking amplifier 306, offset lines 308 and 310, a first quarter wave transmission line 312, and a second quarter wave transmission line 314.

The power divider 300 splits the signal input to the Doherty amplifier into two power signals. Next, the power divider 300 sends one of the two split power signals to the peaking amplifier 306, and the other to the carrier amplifier 304.

The transmission line 302 synchronizes phases of the signal fed from the power divider 300 to the peaking amplifier 306 and the signal fed from the power divider 300 to the carrier amplifier 304. When the phases of the two signals output from the power divider 300 to the carrier amplifier 304 and the peaking amplifier 306 are the same, the transmission line 302 can be excluded.

The carrier amplifier 304 amplifies the power of the signal fed from the power divider 300. The peaking amplifier 306 amplifies the power of the signal fed from the power divider 300. The size of the peaking amplifier 306 is different from the size of the carrier amplifier 304 according to the backoff level.

The minimum values of the input signals for operating the carrier amplifier 304 and the peaking amplifier 306 are different from each other. That is, the minimum value of the input power for operating the peaking amplifier 306 is greater than the minimum value of the input power for operating the carrier amplifier 304. Hence, there exists a power range not operating the peaking amplifier 306 even when the carrier amplifier 304 operates.

The offset lines 308 and 310 modulate the load when the peaking amplifier 306 does not operate. For example, the first offset line 308 connected to the end of the carrier amplifier 304 applies the load modulation not only to the real component but also to the imaginary component. The second offset line 310 connected to the end of the peaking amplifier 306 increases the output impedance when the peaking amplifier 306 does not operate, so as to block the output power leakage of the carrier amplifier 304 and to achieve the precise load modulation.

For the Doherty operation, the first quarter wave transmission line 312 and the second quarter wave transmission line 314 alter the load impedance according to whether the peaking amplifier 306 operates.

The first quarter wave transmission line 312 is interposed between the offset lines 308 and 310, and serves as an impedance inverter. That is, the first quarter wave transmission line 312 inverts the load impedance.

The second quarter wave transmission line 314 is interposed between the output stage and the offset line 310. Hereafter, the first quarter wave transmission line 312 and the second quarter wave transmission line 314 are referred to as an output combiner.

As such, since the size ratio of the carrier amplifier 304 and the peaking amplifier 306 of the Doherty power amplifier is different, the first quarter wave transmission line 312 and the second quarter wave transmission line 314 are constructed as shown in FIG. 4, to linearly combine the output powers of the power amplifiers.

Figure 4A:
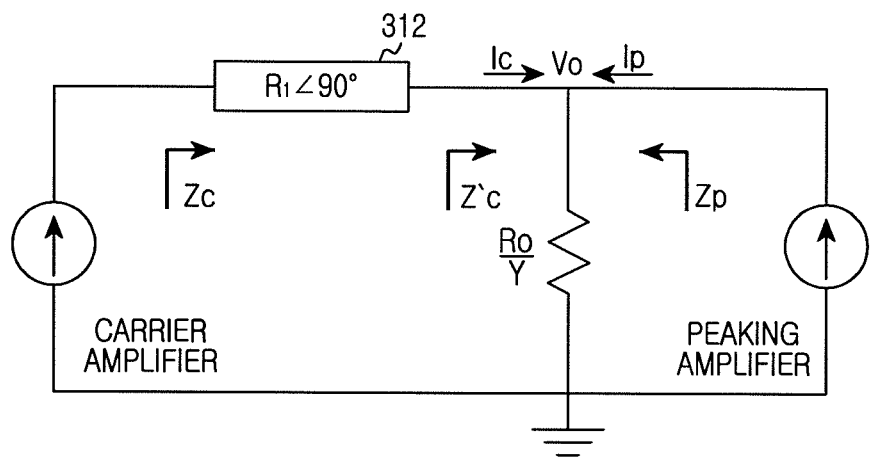
FIGS. 4A and 4B illustrate equivalent circuits of the Doherty power amplifier according to an embodiment of the present disclosure.
Figure 4B:
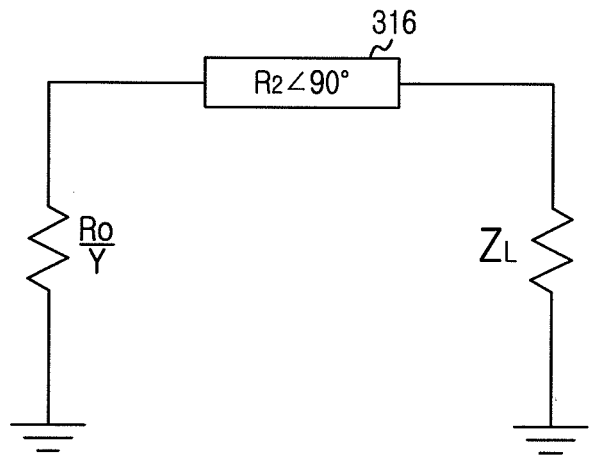

FIGS. 4A and 4B depict equivalent circuits of the Doherty power amplifier according to an embodiment of the present disclosure. Herein, the size ratio of the carrier amplifier 304 and the peaking amplifier 306 is assumed to be 1:δ.

FIG. 4A depicts the first quarter wave transmission line 312, and FIG. 4B depicts the second quarter wave transmission line 314.

Since the size ratio of the carrier amplifier 304 and the peaking amplifier 306 is different in FIGS. 4A and 4B, the carrier amplifier 304 modulates the load from $(1+\delta) \times R_0$ to $R_0$. Herein, $R_0$ denotes the output load of the Doherty power amplifier.

When the open circuit impedance is sustained and then turned on, the peaking amplifier 306 has the load gradually converging to $R_0$. Hence, the asymmetric Doherty power amplifier acquires the backoff level of $20 \times \log(1+\delta)$ through the load modulation of the carrier amplifier 304 and the peaking amplifier 306 with the first quarter wave transmission line 312 and the second quarter wave transmission line 314. In so doing, the Doherty power amplifier uses a method for linearly combining the output powers of the carrier amplifier 304 and the peaking power amplifier 306 of the different sizes.

According to characteristics of the quarter wave transmission line, the square of the characteristic impedance $R_1$ of the transmission line is equal to the product of the input and output impedances $Z_c$ and $Z_c'$ as shown in FIG. 4B. In the backoff level period, the carrier amplifier 304 is associated with the load of $(1+\delta) \times R_0$. For doing, so, the first quarter wave transmission line 312 functions to modulate the load of $Z_c' = R_0/Y$ to the load of $(1+\delta) \times R_0$. Hence, the load resistance modulation condition of the carrier amplifier 304 in the backoff level period is given by Equation 2.

$$R_1^2 = (1+\delta) \times R_0 \times \frac{R_0}{Y} = \frac{1+\delta}{Y} \times R_0^2 \quad \text{[Eqn. 2]}$$

In Equation 2, $R_1$ denotes the characteristic impedance of the first quarter wave transmission line 312, δ denotes the size ratio of the carrier amplifier 304 and the peaking amplifier 306, $R_0$ denotes the output load of the Doherty power amplifier, and Y denotes the code modulation rate between $R_0$ and $Z_L$.

In the maximum power output period, both of the carrier amplifier 304 and the peaking amplifier 306 have the load resistance of $R_0$. Accordingly, the load impedance applied to $Z_c'$ is changed to the load of $(R_1)^2 R_0$ by $R_1$. In so doing, since the load impedance of the peaking amplifier 306 is $R_0$, the load relation in an output power node $V_0$ is given by Equation 3.

$$\frac{R_1^2}{R_0} \| R_0 = \frac{R_0}{Y} \therefore R_1^2 = \frac{R_2^2}{Y-1} \quad \text{[Eqn. 3]}$$

In Equation 3, $R_1$ denotes the characteristic impedance of the first quarter wave transmission line 312, $R_0$ denotes the output load of the Doherty power amplifier, and Y denotes the code modulation rate between $R_0$ and $Z_L$.

The impedance transformation rate Y, the resistance $R_1$ of the first quarter wave transmission line 312, and the resistance $R_2$ of the second quarter wave transmission line 314 can be calculated based on Equation 4 using Equation 2 and Equation 3.

$$Y = \frac{1+\delta}{\delta}, R_1 = \sqrt{\delta} \times R_0, R_2 = \sqrt{\frac{\delta}{1+\delta}} \times R_0 \qquad \text{[Eqn. 4]}$$

In Equation 4, Y denotes the impedance transformation rate which is the code modulation rate between $R_0$ and $Z_L$, $\delta$ denotes the size ratio of the carrier amplifier 304 and the peaking amplifier 306, $R_1$ denotes the resistance for the characteristic impedance of the first quarter wave transmission line 312, $R_0$ denotes the output load of the Doherty power amplifier, and $R_2$ denotes the resistance for the characteristic impedance of the second quarter wave transmission line 314.

As stated above, when the size rates of the carrier amplifier 304 and the peaking amplifier 306 are different, the Doherty power amplifier defines $R_1$ and $R_2$ based on Equation 4 in order to linearly combine the output powers of the carrier amplifier 304 and the peaking amplifier 306.

A current component ratio $\alpha$ of the carrier amplifier 304 and the peaking amplifier 306 can be given by Equation 5.

$$V_0 = \frac{R_0}{Y} \times (Ic + Ip) \| \alpha = \frac{Ip}{Ic}, Z'_c = \frac{R_0}{Y} \times (1+\alpha) \qquad \text{[Eqn. 5]}$$

In Equation 5, $V_0$ denotes the sum of the output voltages of the carrier amplifier 304 and the peaking amplifier 306, $R_0$ denotes the output load of the Doherty power amplifier, Y denotes the code modulation rate between $R_0$ and $Z_L$, $\alpha$ denotes the current component ratio of the carrier amplifier 304 and the peaking amplifier 306, Ip denotes the current of the peaking current 306, and Ic denotes the current of the carrier amplifier 304.

Since the size of the peaking amplifier 306 is greater than the size of the carrier amplifier 304 in the asymmetric Doherty power amplifier, $\alpha$ changes from 0 to according to the input power level. Hence, the load $Z_c$ of the carrier amplifier 304 can be given by Equation 6 using Equation 4 and Equation 5.

$$Z_C = \frac{Z_{01}^2}{Z'_C} = \frac{\alpha \cdot R_0^2}{1+\alpha} \times \frac{1+\alpha}{R_0 \times \delta} = \frac{1+\delta}{1+\alpha} \times R_0 \qquad \text{[Eqn. 6]}$$

In Equation 6, $Z_c$ denotes the load of the carrier amplifier 304, $R_0$ denotes the output load of the Doherty power amplifier, and $\alpha$ denotes the current component ratio of the carrier amplifier 304 and the peaking amplifier 306.

The load $Z_p$ of the peaking amplifier 306 can be given by Equation 7 using Equation 4 and Equation 5.

$$Z_p = \left(1+\frac{1}{\alpha}\right) \times \frac{R_0}{Y} = \frac{1+\alpha}{\alpha} \times \frac{\sigma}{1+\delta} \times R_0 \qquad \text{[Eqn. 7]}$$

In Equation 7, $Z_p$ denotes the load of the peaking amplifier 306, $R_0$ denotes the output load of the Doherty power amplifier, Y denotes the code modulation rate between $R_0$ and $Z_L$, and $\alpha$ denotes the current component ratio of the carrier amplifier 304 and the peaking amplifier 306.

The load of the carrier amplifier 304 is modulated from $(1+\delta) \times R_0$ to $R_0$ based on Equation 6. The load of the peaking amplifier 306 is modulated from the open impedance to $R_0$ based on Equation 7. That is, since the carrier amplifier 304 and the peaking amplifier 306 are modulated to the load of $R_0$ in the maximum output power, the output power combiner of the Doherty power amplifier can combine the output powers of the two amplifiers without loss. For example, for the modulation signal having the PAPR of 8.5 dB in FIG. 2, the backoff level of the Doherty power amplifier achieves the highest efficiency at 8.3 dB. The Doherty power amplifier maintains the size ratio of the carrier amplifier 304 and the peaking amplifier 306 as 1:1.6. In this situation, it is designed to obtain $\alpha=1.6$, $\delta=1.6$, $Y=1.625$, $R_1=63.246\Omega$, and $R_2=39.223\Omega$.

Figure 5A:
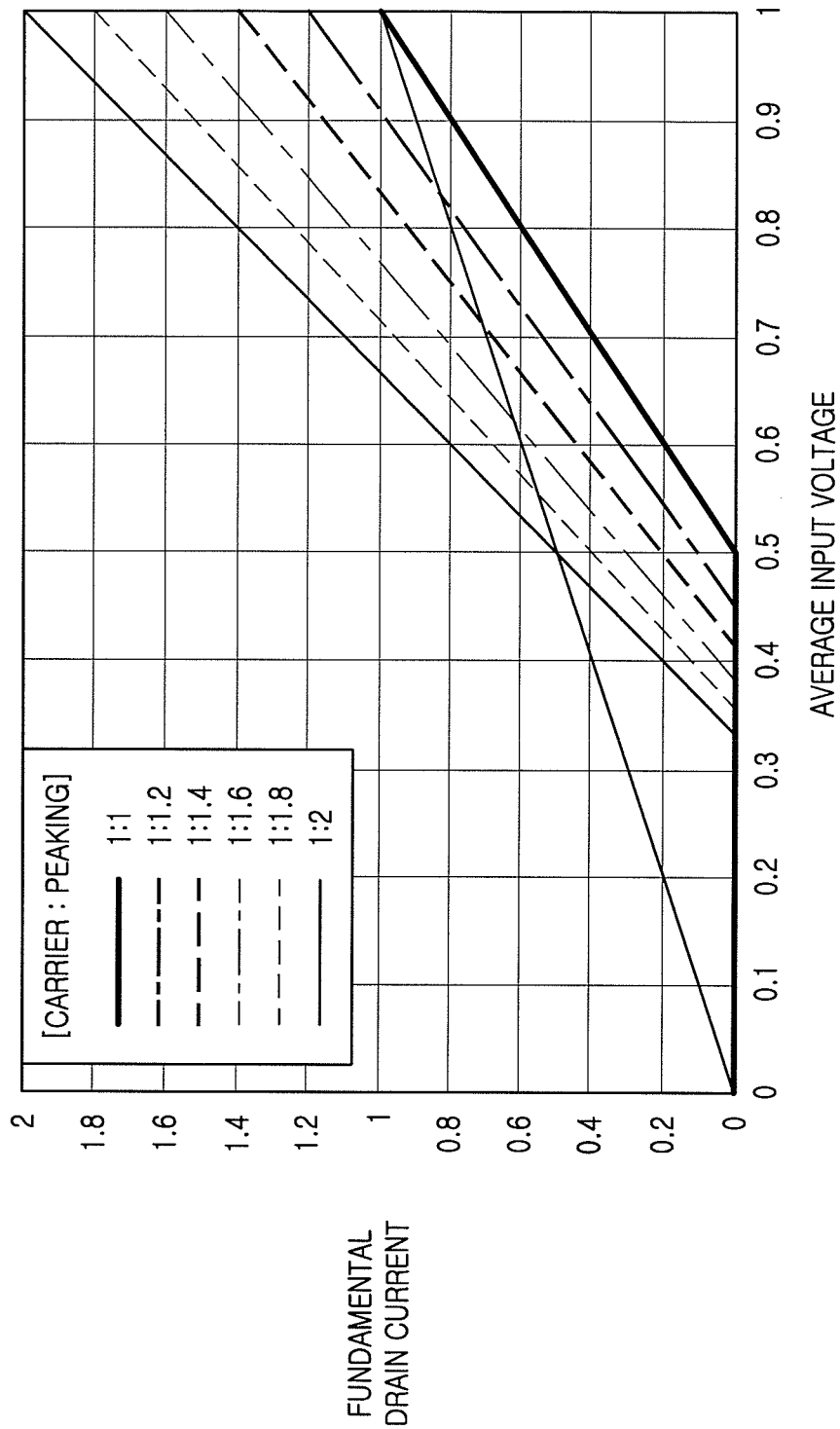
FIGS. 5A, 5B and 5C illustrate performance variation of the Doherty power amplifier according to an embodiment of the present disclosure.
Figure 5B:
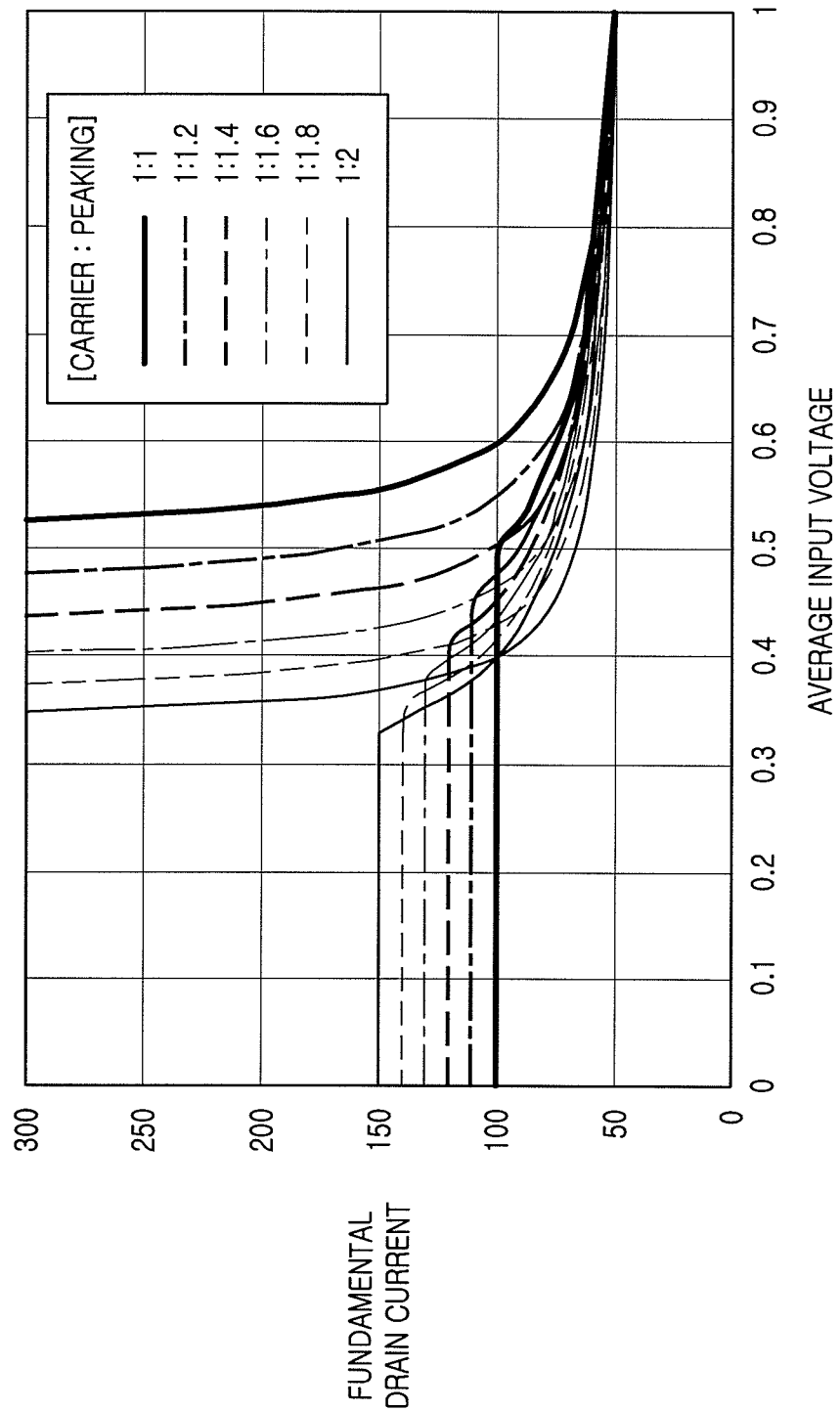
Figure 5C:
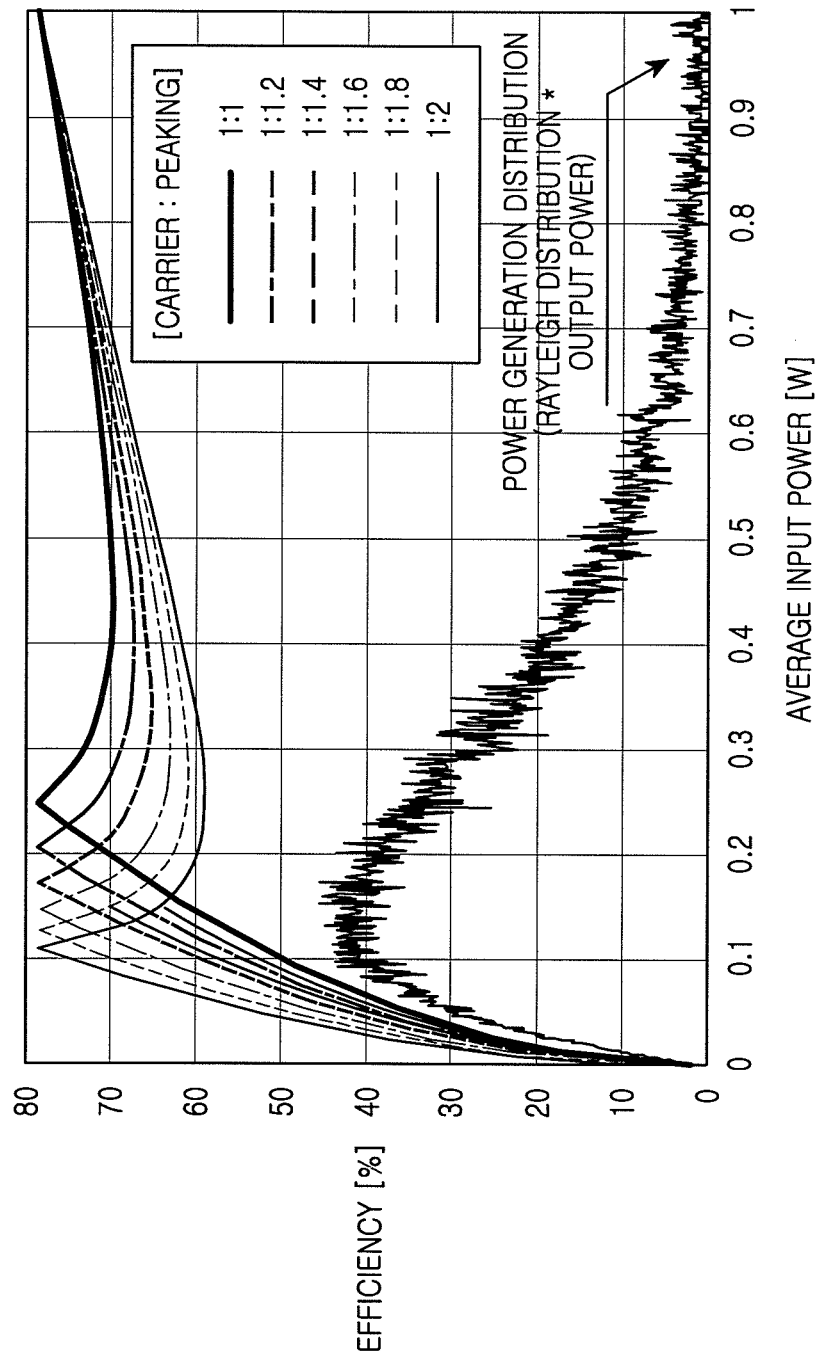

FIGS. 5A, 5B and 5C depict the performance change of the Doherty power amplifier according to an embodiment of the present disclosure.

FIG. 5A shows a fundamental drain current according to the size ratio of the carrier amplifier 304 and the peaking amplifier 306, FIG. 5B shows the load resistance according to the size ratio of the carrier amplifier 304 and the peaking amplifier 306, and FIG. 5C shows the efficiency according to the size ratio of the carrier amplifier 304 and the peaking amplifier 306.

When the sizes of the carrier amplifier 304 and the peaking amplifier 306 are asymmetric as shown in FIG. 5A, the fundamental drain current component of the peaking amplifier 306 having the greater output power has the greater magnitude in the maximum input power period. As the size of the peaking amplifier 306 increases according to the input voltage level, the turn-on time of the peaking amplifier 306 is moved forward.

As the size of the peaking amplifier 306 increases, the load of the carrier amplifier 304 converges on $R_0$ in the greater load as shown in FIG. 5B.

As the size of the peaking amplifier 306 increases, the backoff level of the Doherty power amplifier gradually increases as shown in FIG. 5C.

As above, the asymmetric Doherty power amplifier determines the size ratio of the carrier amplifier 304 and the peaking amplifier 306 according to the backoff level. In so doing, the asymmetric Doherty power amplifier determines $R_1$ and $R_2$ differently according to the size ratio of the carrier amplifier 304 and the peaking amplifier 306.

The Doherty power amplifier has the on-resistance according to the knee voltage of the actual power device constituting the power amplifier. In so doing, the Doherty power amplifier cannot obtain the backoff level period of Equation 2 according to the on-resistance. Hence, the Doherty power amplifier can degrade the average efficiency and the maximum output power.

Figure 6A:
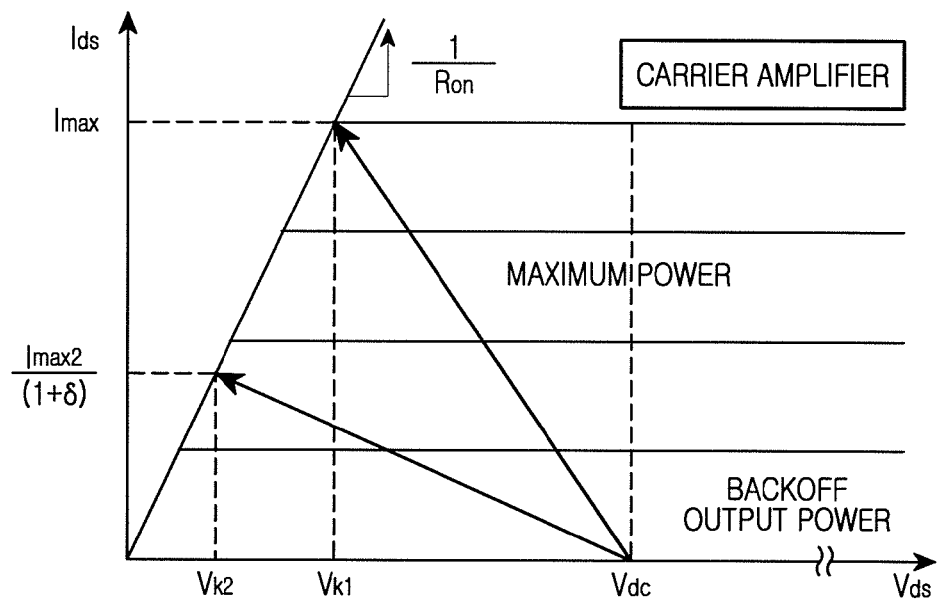
FIGS. 6A and 6B illustrate DC-IV of a power device having on-resistance in the Doherty power amplifier according to an embodiment of the present disclosure.
Figure 6B:
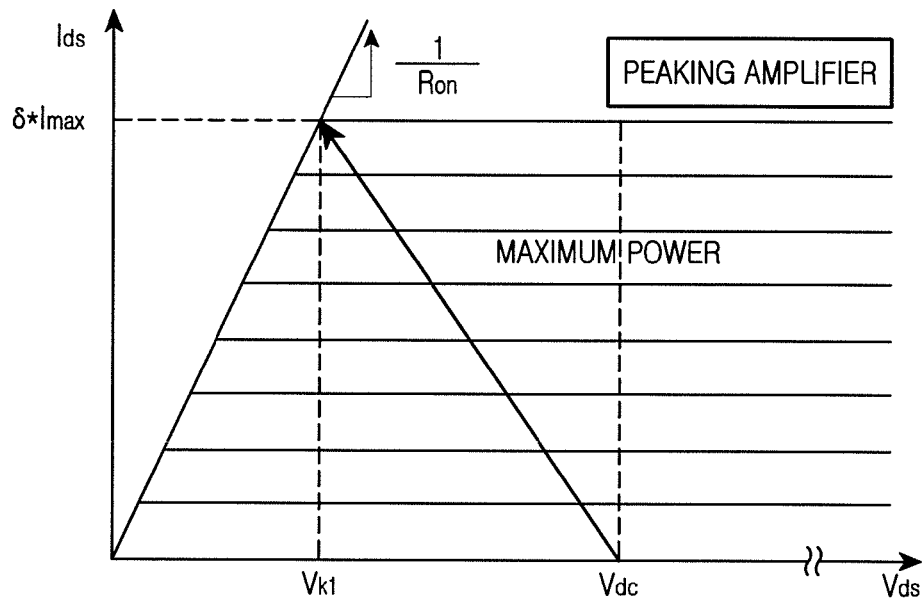

FIGS. 6A and 6B illustrate DC-IV of the power device having the on-resistance in the Doherty power amplifier according to an embodiment of the present disclosure. Hereafter, it is assumed that the on-resistance is fixed according to the level of the input power, gm of the power device is fixed according to the power level, and the carrier amplifier and the peaking amplifier include a power amplifier of a class B mode. Herein, the gm indicates transconductance.

FIG. 6A depicts a load line according to the output power level of the carrier amplifier, and FIG. 6B depicts a load line according to the output power level of the peaking amplifier.

The carrier amplifier of the asymmetric Doherty power amplifier includes the on-resistance according to the knee voltages $V_{k1}$ and $V_{k2}$ based on Equation 8 as shown in FIG. 6A.

$$R_{ON\_C} = \frac{V_{k1}}{I\_max} = \frac{(1+\delta)}{I\_max} * V_{k2} \qquad \text{[Eqn. 8]}$$

In Equation 8, $R_{ON\_C}$ denotes the on-resistance of the carrier amplifier, $V_{k1}$ and $V_{k2}$ denote the knee voltages of the carrier amplifier, I_max denotes the maximum current level of the carrier amplifier, and δ denotes the size ratio of the carrier amplifier and the peaking amplifier.

The knee voltage of the carrier amplifier can be given by Equation 9 using Equation 8.

$$\therefore V_{k1} = R_{ON\_C} * \text{I\_max}, \quad V_{k2} = \frac{V_{k1}}{1+\delta} \qquad \text{[Eqn. 9]}$$

$R_{ON\_C}$ denotes the on-resistance of the carrier amplifier, $V_{k1}$ and $V_{k2}$ denote the knee voltages of the carrier amplifier, I_max denotes the maximum current level of the carrier amplifier, and δ denotes the size ratio of the carrier amplifier and the peaking amplifier.

An optimum impedance to be matched by the carrier amplifier in the maximum output power can be given by Equation 10 using Equation 8.

$$R_{OPT\_C\_PEP} = 2 * \frac{Vdc - V_{k1}}{\text{I\_max}} \qquad \text{[Eqn. 10]}$$

$R_{OPT\_C\_PEP}$ denotes the optimum impedance to be matched by the carrier amplifier in the maximum output power, Vdc denotes a DC bias voltage, $V_{k1}$ denotes the knee voltage of the carrier amplifier, and I_max denotes the maximum current level of the carrier amplifier.

Accordingly, the output power $PEP_c$ of the carrier amplifier for sending the maximum output power can be given by Equation 11 using Equation 8, Equation 9, and Equation 10.

$$\therefore PEP_C = \frac{1}{4} * \text{I\_max} * (Vdc - V_{k1}) \qquad \text{[Eqn. 11]}$$

PEP denotes the output power of the carrier amplifier for sending the maximum output power, I_max denotes the maximum current level of the carrier amplifier, Vdc denotes the DC bias voltage, and $V_{k1}$ denotes the knee voltage of the carrier amplifier.

The efficiency $\eta_{PEP\_c}$ of the carrier amplifier for sending the maximum output power can be given by Equation 12 using Equation 8, Equation 9, and Equation 10.

$$\therefore \eta_{PEP\_C} = \frac{\pi}{4} * \frac{Vdc - V_{k1}}{Vdc} \qquad \text{[Eqn. 12]}$$

$\eta_{PEP\_C}$ denotes the efficiency of the carrier amplifier for sending the maximum output power, Vdc denotes the DC bias voltage, and $V_{k1}$ denotes the knee voltage of the carrier amplifier.

As the knee voltage $V_{k1}$ increases, the maximum output power and the efficiency decrease based on Equation 11 and Equation 12. Hence, the output power $Pout_{BO}$ and the efficiency $\eta_{BO}$ of the carrier amplifier in the backoff output power can be given by Equation 14 and Equation 15.

$$R_{OPT\_C\_BO} = \frac{Vdc - V_{k2}}{\left(\frac{\text{I\_max}}{2*(1+\delta)}\right)} \qquad \text{[Eqn. 13]}$$
$$= \frac{2*[(1+\delta)*Vdc - V_{k1}]}{\text{I\_max}}$$
$$= R_{OPT\_C\_PEP} + \frac{2*\delta*Vdc}{\text{I\_max}}$$

In Equation 13, $R_{OPT\_C\_BO}$ denotes the optimum impedance to be matched by the carrier amplifier in the backoff output power, Vdc denotes the DC bias voltage, I_max denotes the maximum current level of the carrier amplifier, δ denotes the size ratio of the carrier amplifier and the peaking amplifier, and $V_{k1}$ and $V_{k2}$ denote the knee voltages of the carrier amplifier.

$$\therefore Pout_{BO} = \frac{1}{2} * \frac{\text{I\_max}}{(1+\delta)} * \frac{1}{2} * (Vdc - V_{k2}) \qquad \text{[Eqn. 14]}$$
$$= \frac{\text{I\_max}}{4*(1+\delta)} * \left(Vdc - \frac{V_{k1}}{(1+\delta)}\right)$$

In Equation 14, $Pout_{BO}$ denotes the output power of the carrier amplifier for sending the backoff output power, I_max denotes the maximum current level of the carrier amplifier, Vdc denotes the DC bias voltage, $V_{k1}$ denotes the knee voltage of the carrier amplifier, and δ denotes the size ratio of the carrier amplifier and the peaking amplifier.

$$\therefore \eta_{BO} = \frac{\pi}{4} * \frac{Vdc - \frac{V_{k1}}{(1+\delta)}}{Vdc} \qquad \text{[Eqn. 15]}$$

In Equation 15, $\eta_{BO}$ denotes the efficiency of the carrier amplifier for sending the backoff output power, Vdc denotes the DC bias voltage, $V_{k1}$ denotes the knee voltage of the carrier amplifier, and δ denotes the size ratio of the carrier amplifier and the peaking amplifier.

As the knee voltage $V_{k1}$ increases in Equation 11 and Equation 12, the output power and the efficiency in the backoff region reduce in Equation 14 and Equation 15.

It is assumed that the peaking amplifier of the asymmetric Doherty power amplifier includes the on-resistance according to the knee voltages $V_{k1}$ and $V_{k2}$ based on Equation 16 as shown in FIG. 6B.

$$R_{ON\_P} = \frac{V_{k1}}{\delta * \text{I\_max}} = \frac{R_{ON\_C}}{\delta} \qquad \text{[Eqn. 16]}$$

In Equation 16, $R_{ON\_P}$ denotes the on-resistance of the peaking amplifier, $V_{k1}$ and $V_{k2}$ denote the knee voltages of the peaking amplifier, I_max denotes the maximum current level of the peaking amplifier, and δ denotes the size ratio of the carrier amplifier and the peaking amplifier.

The optimum impedance to be matched by the peaking amplifier in the maximum output power can be given by Equation 17 using Equation 16.

$$R_{OPT\_P\_PEP} = 2 * \frac{Vdc - V_{k1}}{\delta * I\_max} = \frac{R_{OPT\_C\_PEP}}{\delta} \quad \text{[Eqn. 17]}$$

$R_{OPT\_P\_PEP}$ denotes the optimum impedance to be matched by the peaking amplifier in the maximum output power, Vdc denotes the DC bias voltage, $V_{k1}$ denotes the knee voltage of the peaking amplifier, I_max denotes the maximum current level of the peaking amplifier, and δ denotes the size ratio of the carrier amplifier and the peaking amplifier.

Thus, the output power $PEP_P$ of the peaking amplifier for sending the maximum output power can be given by Equation 18 using Equation 16 and Equation 17.

$$\therefore PEP_P = \delta * PEP_C \quad \text{[Eqn. 18]}$$

In Equation 18, $PEP_P$ denotes the output power of the peaking amplifier for sending the maximum output power, $PEP_C$ denotes the output power of the carrier amplifier for sending the maximum output power, and δ denotes the size ratio of the carrier amplifier and the peaking amplifier.

The efficiency $\eta_{PEP\_c}$ of the peaking amplifier for sending the maximum output power can be given by Equation 19 using Equation 16 and Equation 17.

$$\therefore \eta_{PEP\_P} = \frac{\left(\frac{1}{4}\right) * (Vdc - V_{k1}) * (1+\delta) * I\_max}{Vdc * \left(\frac{1}{\pi}\right) * (1+\delta) * I\_max} \quad \text{[Eqn. 19]}$$

$$= \eta_{PEP\_C}$$

$\eta_{PEP\_c}$ denotes the efficiency of the peaking amplifier for sending the maximum output power, Vdc denotes the DC bias voltage, $V_{k1}$ denotes the knee voltage of the peaking amplifier, and δ denotes the size ratio of the carrier amplifier and the peaking amplifier.

Figure 7A:
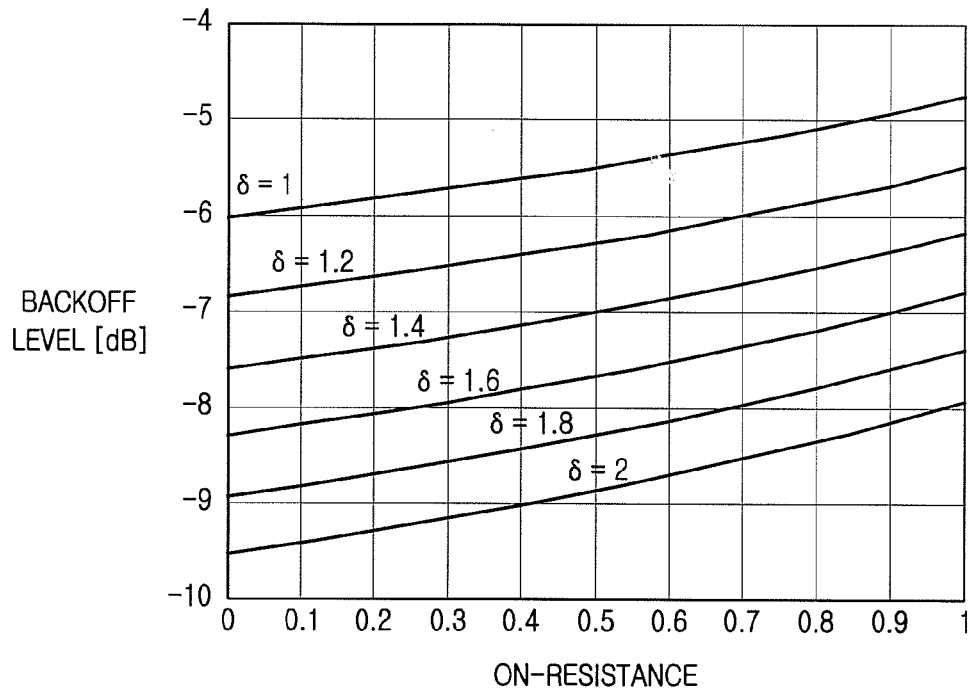
FIGS. 7A and 7B illustrate backoff level change based on the on-resistance, backoff output power, and efficiency characteristics in a maximum output power region in the Doherty power amplifier according to an embodiment of the present disclosure.
Figure 7B:
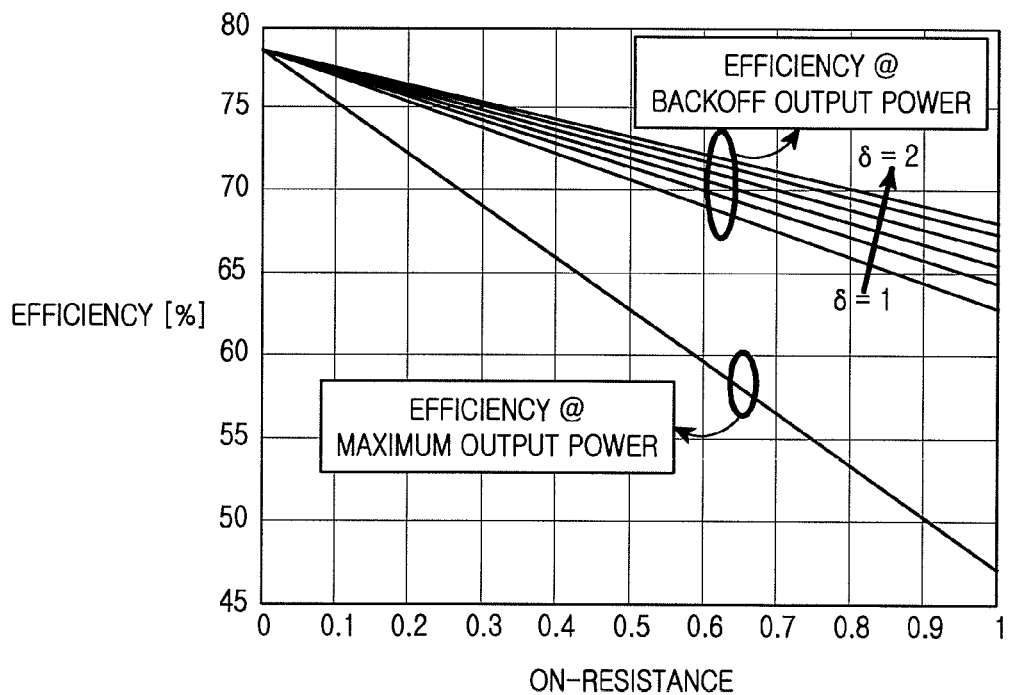

FIGS. 7A and 7B illustrate the backoff level change based on the on-resistance, the backoff output power, and efficiency characteristics in the maximum output power region in the Doherty power amplifier according to an embodiment of the present disclosure.

FIG. 7A depicts the backoff level based on the on-resistance, and FIG. 7B depicts the efficiency of the asymmetric Doherty power amplifier based on the on-resistance.

As the on-resistance increases, the backoff level gradually decreases as shown in FIG. 7A. For example, the asymmetric Doherty power amplifier having the size ratio of 1:2 sustains the backoff level of −9.54 dB. However, with the on-resistance of 0.5 ohm, the backoff level greatly shifts from −9.54 dB to −8.8 dB. When the backoff level decreases, the turn-on time of the peaking power amplifier is delayed and thus the maximum output power of the Doherty power amplifier reduces. When the peaking power amplifier is precisely turned on at the backoff level without the on-resistance, the efficiency in the backoff output power remarkably lowers.

As the on-resistance increases, the knee voltage of the power device increases as shown in FIG. 7B. Hence, the backoff output power and the efficiency of the maximum output power reduce. The efficiency of the backoff output power gradually lowers because the rate of the knee voltage in view of the carrier amplifier is smaller than the rate of the maximum output power and the efficiency of not only the carrier amplifier but also the peaking amplifier reduces in the maximum output power.

As stated above, for the modulation signal with the PAPR given, the asymmetric Doherty power amplifier determines the backoff level for the highest average efficiency. In so doing, the asymmetric Doherty power amplifier obtains the distortion degree of the backoff level in advance according to the on-resistance based on the power device and updates the sized ratio of the carrier amplifier and the peaking amplifier. Using the power device having the on-resistance, the asymmetric Doherty power amplifier retains the size ratio greater than the size ratio without the on-resistance. For example, the asymmetric Doherty power amplifier having the on-resistance of zero determines the size of the peaking amplifier to sustain the size ratio of 1:1.6 to obtain the backoff level of 8.3 dB in FIG. 7A. The asymmetric Doherty power amplifier having the on-resistance of 0.5 increases the size ratio of the two amplifiers to 1:1.8.

Now, a method for amplifying a signal by considering the on-resistance based on the PAPR in the asymmetric Doherty power amplifier is explained.

Figure 8:
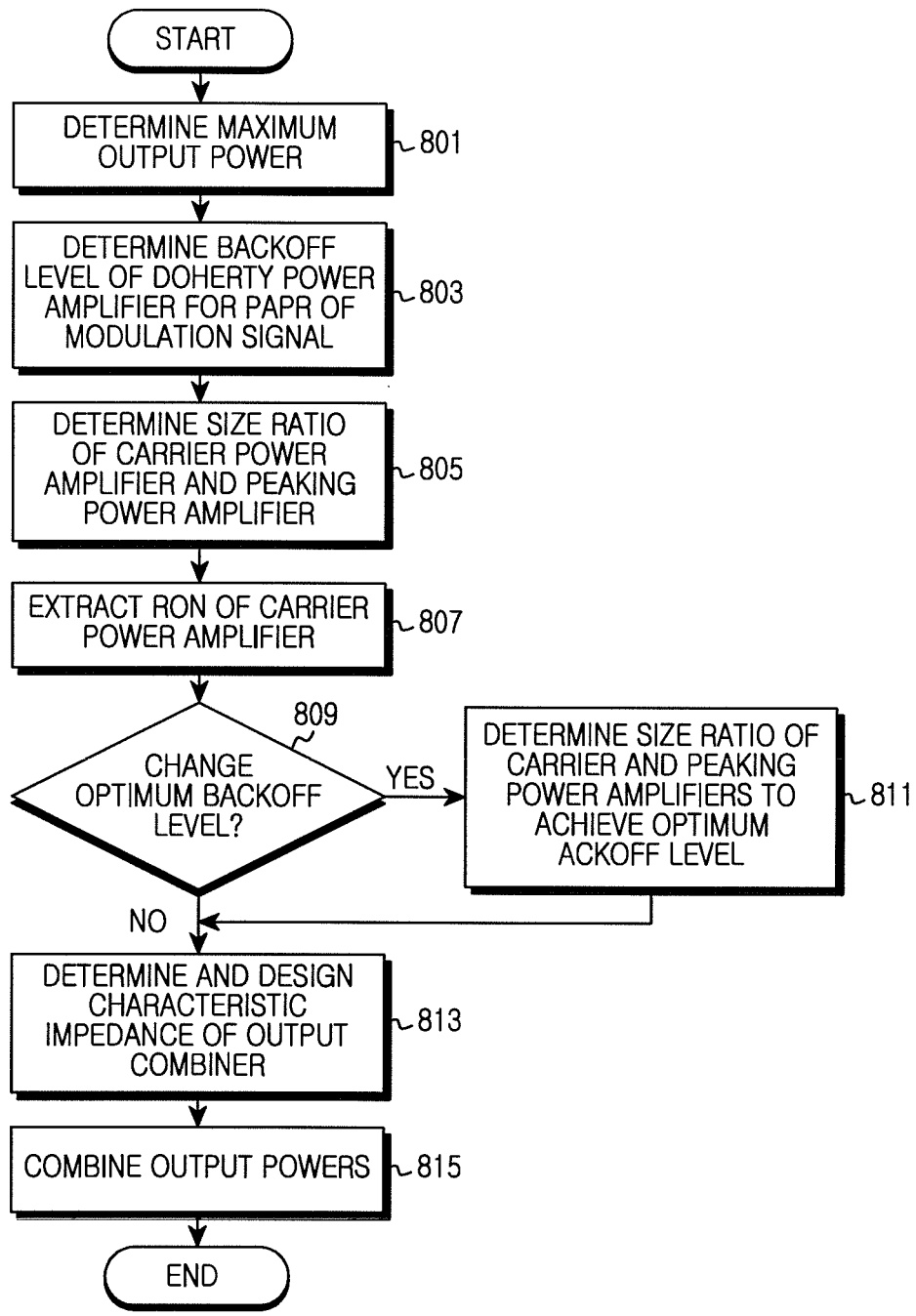
FIG. 8 illustrates a method for amplifying a modulation signal by considering the on-resistance according to PAPR in the Doherty power amplifier according to an embodiment of the present disclosure.

FIG. 8 illustrates a method for amplifying the modulation signal by considering the on-resistance according to the PAPR in the Doherty power amplifier according to an embodiment of the present disclosure.

In step 801, the asymmetric Doherty power amplifier determines its maximum output. For example, the Doherty power amplifier determines its maximum output according to its use.

In step 803, the asymmetric Doherty power amplifier detects its optimum backoff level for the PAPR of the received modulation signal.

In step 805, the asymmetric Doherty power amplifier determines the size ratio of the carrier amplifier and the peaking amplifier by considering the maximum output and the optimum backoff level.

In step 807, the asymmetric Doherty power amplifier estimates the on-resistance of the carrier amplifier. For example, the asymmetric Doherty power amplifier extracts the on-resistance of the knee voltage through the DC-IV curve of the power device constituting the Doherty power amplifier.

In step 809, the asymmetric Doherty power amplifier determines whether the optimum backoff level is changed by the on-resistance.

When the optimum backoff level is changed by the on-resistance, the asymmetric Doherty power amplifier re-determines the size ratio of the carrier amplifier and the peaking amplifier by taking account of the changed optimum backoff level in step 811.

In step 813, the asymmetric Doherty power amplifier determines the characteristic impedance of the output combiner for the carrier amplifier and the peaking amplifier of the different sizes by considering the re-determined size ratio of the carrier amplifier and the peaking amplifier. For example, the asymmetric Doherty power amplifier calculates the characteristic impedance of the output combiner based on Equation 4.

By contrast, when the optimum backoff level is not changed by the on-resistance, in step 813, the asymmetric Doherty power amplifier determines the characteristic impedance of the output combiner for the carrier amplifier and the peaking amplifier of the different sizes by considering the size ratio of the carrier amplifier and the peaking amplifier determined in step 803. For example, the asymmetric Doherty power amplifier calculates the characteristic impedance of the output combiner based on Equation 4.

In step 815, the asymmetric Doherty power amplifier combines the output powers of the carrier amplifier and the peaking amplifier using the determined characteristic impedance.

Next, the asymmetric Doherty power amplifier finishes this process.

As set forth above, the Doherty power amplifier adjusts the ratio of the carrier amplifier and the peaking amplifier and compensates for the on-resistance of the carrier amplifier. Thus, the maximum efficiency can be attained in the backoff region, and the maximum output power of the Doherty power amplifier can be achieved and the average output efficiency can be enhanced at the same time by combining the output powers of the power amplifiers without loss.

Further, since the Doherty power amplifier adjusts the ratio of the carrier amplifier and the peaking amplifier and compensates for the on-resistance of the carrier amplifier, the linearity of the Doherty power amplifier can be further improved by achieving the maximum output power, the heat of the Doherty power amplifier apparatus can be reduced due to the improved average output efficiency, and the heat radiation structure can be miniaturized.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. An apparatus for use in a power amplifier, comprising:
a power divider configured to provide a power signal to a carrier amplifier and a peaking amplifier;
the carrier amplifier configured to amplify a power of the signal input from the power divider;
the peaking amplifier configured to have a maximum output power magnitude different from the carrier amplifier and amplify the power of the signal input from the power divider;
at least two offset transmission lines disposed at ends of the carrier amplifier and the peaking amplifier and configured to regulate a load impedance; and
an output combiner configured to combine outputs of the carrier amplifier and the peaking amplifier of different sizes, and to output the combined output,
wherein a size ratio of the peaking amplifier and the carrier amplifier is determined by considering a backoff level having a maximum average efficiency for a Peak to Average Power Ratio (PAPR) of a modulation signal and an on-resistance of the carrier amplifier.

2. The apparatus of claim 1, further comprising:
a phase delay component disposed at an input stage of the peaking amplifier and configured to match phases of the carrier amplifier and the peaking amplifier.

3. The apparatus of claim 1, wherein the on-resistance of the carrier amplifier is estimated by considering a knee voltage of the carrier amplifier.

4. The apparatus of claim 1, wherein the output combiner comprises at least two quarter wave transmission lines having a characteristic impedance different from an output load impedance of the power amplifier.

5. The apparatus of claim 4, wherein the at least two quarter wave transmission lines comprise:
a first quarter wave transmission line connected in series to a first offset transmission line disposed at an end of the carrier amplifier; and
a second quarter wave transmission line interposed in series between a part where the outputs of the carrier amplifier and the peaking amplifier are combined and a final output load of the power amplifier, the second quarter wave transmission line configured to convert a load resistance value.

6. The apparatus of claim 5, wherein the first quarter wave transmission line comprises a characteristic impedance which is $\sqrt{\delta}$ times the output load impedance of the power amplifier, and
$\delta$ denotes the size ratio of the carrier amplifier and the peaking amplifier.

7. The apparatus of claim 5, wherein the second quarter wave transmission line comprises a characteristic impedance which is $$\sqrt{\frac{\delta}{1+\delta}}$$

times the output load impedance of the power amplifier, and
$\delta$ denotes the size ratio of the carrier amplifier and the peaking amplifier.

8. An operating method of a power amplifier, comprising:
determining a maximum output of the power amplifier;
determining a size ratio of a carrier amplifier and a peaking amplifier using, a Peak to Average Power Ratio (PAPR) of a modulation signal;
extracting an on-resistance of the carrier amplifier;
determining whether a backoff level having a maximum average efficiency is changed, by considering the on-resistance;
when the backoff level is changed, updating the size ratio of the carrier amplifier and the peaking amplifier by considering the changed backoff level;
determining at least two characteristic impedances to combine outputs of the carrier amplifier and the peaking amplifier by considering the size ratio of the carrier amplifier and the peaking amplifier; and
combining the outputs amplified by the carrier amplifier and the peaking amplifier using the at least two characteristic impedances.

9. The operating method of claim 8, wherein the determining of the size ratio comprises:
determining the backoff level having the maximum average efficiency using the PAPR of the modulation signal.

10. The operating method of claim 8, wherein the determining of the characteristic impedances comprises:
determining at least two characteristic impedances for combining the outputs of the carrier amplifier and the peaking amplifier by considering the updated size ratio of the carrier amplifier and the peaking amplifier.

11. The operating method of claim 8, wherein the extracting of the on-resistance comprises:
extracting the on-resistance of the carrier amplifier by considering a knee voltage of the carrier amplifier.

12. The operating method of claim 8, wherein the determining of the characteristic impedances comprises:
determining characteristic impedances of a first quarter wave transmission line and a second quarter wave transmission line differently from an output load impedance of the power amplifier,
wherein the first quarter wave transmission line is connected in series to a first offset transmission line disposed at an end of the carrier amplifier, and
the second quarter wave transmission line is interposed in series between a part where the outputs of the carrier amplifier and the peaking amplifier are combined, and a final output load of the power amplifier.

13. The operating method of claim 12, wherein the determining of the characteristic impedances comprises:

determining the characteristic impedance of the first quarter wave transmission line as $\sqrt{\delta}$ times the output load impedance of the power amplifier; and determining the characteristic impedance of the second quarter wave transmission line as $$\sqrt{\frac{\delta}{1+\delta}}$$

times the output load impedance of the power amplifier,
wherein δ denotes the size ratio of the carrier amplifier and the peaking amplifier.

14. A power amplifier, comprising:
a power divider configured to provide a power signal to a carrier amplifier and a peaking amplifier;
the carrier amplifier configured to amplify a power of the signal input from the power divider;
the peaking amplifier configured to have a maximum output power magnitude different from the carrier amplifier and amplify the power of the signal input from the power divider; and
an output combiner configured to combine outputs of the carrier amplifier and the peaking amplifier of different sizes, and to output the combined output,
wherein a size ratio of the peaking amplifier and the carrier amplifier is determined by considering a backoff level having a maximum average efficiency for a Peak to Average Power Ratio (PAPR) of a modulation signal and an on-resistance of the carrier amplifier.

15. The power amplifier of claim 14, further comprising:
a phase delay component disposed at an input stage of the peaking amplifier and matching phases of the carrier amplifier and the peaking amplifier.

16. The power amplifier of claim 14, wherein the output combiner comprises at least two quarter wave transmission lines having a characteristic impedance different from an output load impedance of the power amplifier.

17. The power amplifier of claim 16, wherein the at least two quarter wave transmission lines comprise:
a first quarter wave transmission line connected in series to an offset transmission line disposed at an end of the carrier amplifier; and
a second quarter wave transmission line interposed in series between a part where the outputs of the carrier amplifier and the peaking amplifier are combined and a final output load of the power amplifier, the second quarter wave transmission line configured to convert a load resistance value.

18. The power amplifier of claim 17, wherein the first quarter wave transmission line comprises a characteristic impedance which is $\sqrt{\delta}$ times the output load impedance of the power amplifier, and
δ denotes the size ratio of the carrier amplifier and the peaking amplifier.

19. The power amplifier of claim 17, wherein the second quarter wave transmission line comprises a characteristic impedance which is $$\sqrt{\frac{\delta}{1+\delta}}$$

times the output load impedance of the power amplifier, and
δ denotes the size ratio of the carrier amplifier and the peaking amplifier.

20. The power amplifier of claim 15, wherein the output combiner comprises at least two quarter wave transmission lines having a characteristic impedance different from an output load impedance of the power amplifier.

* * * * *